(12) United States Patent
Mignot et al.

(10) Patent No.: US 12,094,774 B2
(45) Date of Patent: Sep. 17, 2024

(54) BACK-END-OF-LINE SINGLE DAMASCENE TOP VIA SPACER DEFINED BY PILLAR MANDRELS

(71) Applicant: International Business Machines Corporation, Armonk, NY (US)

(72) Inventors: Yann Mignot, Slingerlands, NY (US); Yongan Xu, San Jose, CA (US); Hsueh-Chung Chen, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 447 days.

(21) Appl. No.: 17/474,292

(22) Filed: Sep. 14, 2021

(65) Prior Publication Data
US 2023/0085494 A1 Mar. 16, 2023

(51) Int. Cl.
*H01L 21/768* (2006.01)
*H01L 23/522* (2006.01)
*H01L 23/528* (2006.01)

(52) U.S. Cl.
CPC .. *H01L 21/76885* (2013.01); *H01L 21/76816* (2013.01); *H01L 21/7682* (2013.01); *H01L 21/76834* (2013.01); *H01L 23/5226* (2013.01); *H01L 23/5283* (2013.01)

(58) Field of Classification Search
CPC ............. H01L 23/5226; H01L 23/5283; H01L 21/7681; H01L 21/76808; H01L 2221/1026; H01L 21/76885; H01L 21/76816; H01L 21/7682; H01L 21/76834
See application file for complete search history.

(56) References Cited

U.S. PATENT DOCUMENTS

| 8,298,943 | B1 | 10/2012 | Arnold et al. |
| 9,478,462 | B1 | 10/2016 | Wang et al. |
| 9,607,893 | B1 | 3/2017 | Zhang et al. |
| 9,711,372 | B2 | 7/2017 | Lee et al. |
| 9,984,919 | B1 | 5/2018 | Zhang et al. |

(Continued)

OTHER PUBLICATIONS

Liu et al. Multi-color approach on self-aligned multiple patterning for single line cut application. Conference, Mar. 2018 (Year: 2018).*

(Continued)

*Primary Examiner* — Galina G Yushina
(74) *Attorney, Agent, or Firm* — CANTOR COLBURN LLP; L. Jeffrey Kelly

(57) ABSTRACT

Embodiments of the present invention are directed to fabrication methods and resulting structures having a back-end-of-line (BEOL) single damascene (SD) top via spacer defined by pillar mandrels. In a non-limiting embodiment of the invention, a first conductive line is formed in a first dielectric layer. A mandrel is formed over the first conductive line and a spacer is formed on a sidewall of the mandrel. A portion of a second dielectric layer is recessed to expose a top surface of the spacer and a top surface of the mandrel and the mandrel is removed. The spacer prevents damage to the second dielectric layer while removing the mandrel. The mandrel is replaced with a conductive material. A first portion of the conductive material defines a via and a second portion of the conductive material defines a second conductive line. The via couples the first conductive line to the second conductive line.

8 Claims, 10 Drawing Sheets

(56) References Cited

U.S. PATENT DOCUMENTS

| | | |
|---|---|---|
| 10,115,633 B2 | 10/2018 | Zhang et al. |
| 2009/0087992 A1 | 4/2009 | Srivastava et al. |
| 2009/0200683 A1 | 8/2009 | Colburn et al. |
| 2016/0093501 A1* | 3/2016 | Ogasawara ....... H01L 21/31144 438/714 |
| 2016/0358820 A1 | 12/2016 | Chen et al. |
| 2018/0261457 A1* | 9/2018 | Law ................... H01L 21/0337 |
| 2019/0103305 A1* | 4/2019 | Liu ................... H01L 21/76879 |
| 2021/0125836 A1* | 4/2021 | Huang .............. H01L 21/76802 |
| 2021/0343586 A1* | 11/2021 | Aizawa ............. H01L 21/76816 |
| 2022/0102212 A1* | 3/2022 | Su .................... H01L 21/31144 |

OTHER PUBLICATIONS

Basoene Briggs et al., "N5 technology node dual-damascene interconnects enabled using multi patterning," International Interconnect Technology Conference (IITC), 2017, 3 pp.

* cited by examiner

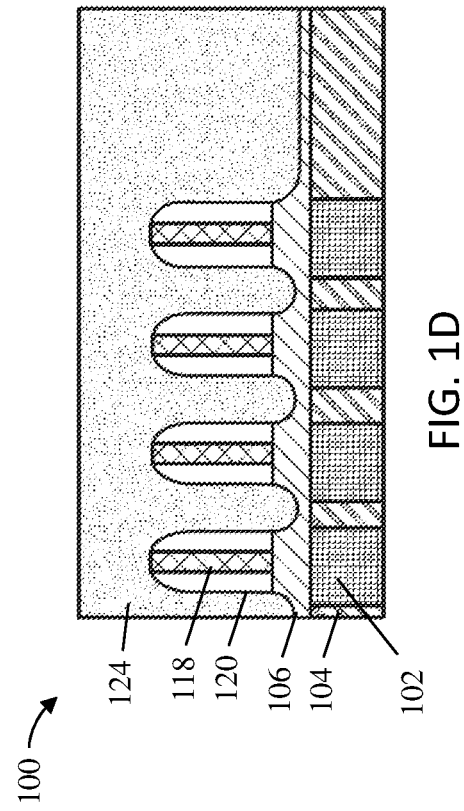
FIG. 1B
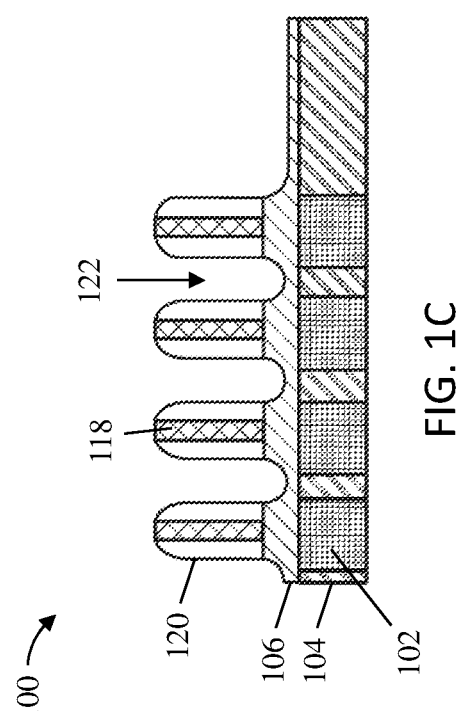
FIG. 1D
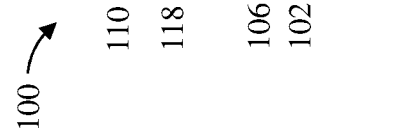
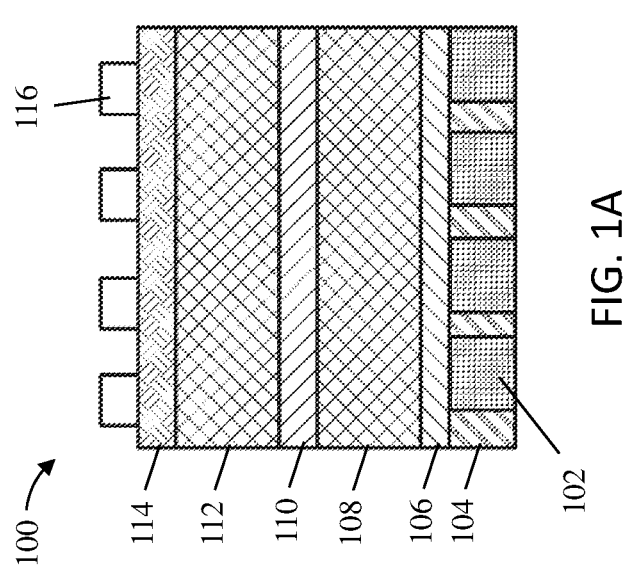
FIG. 1A
FIG. 1C

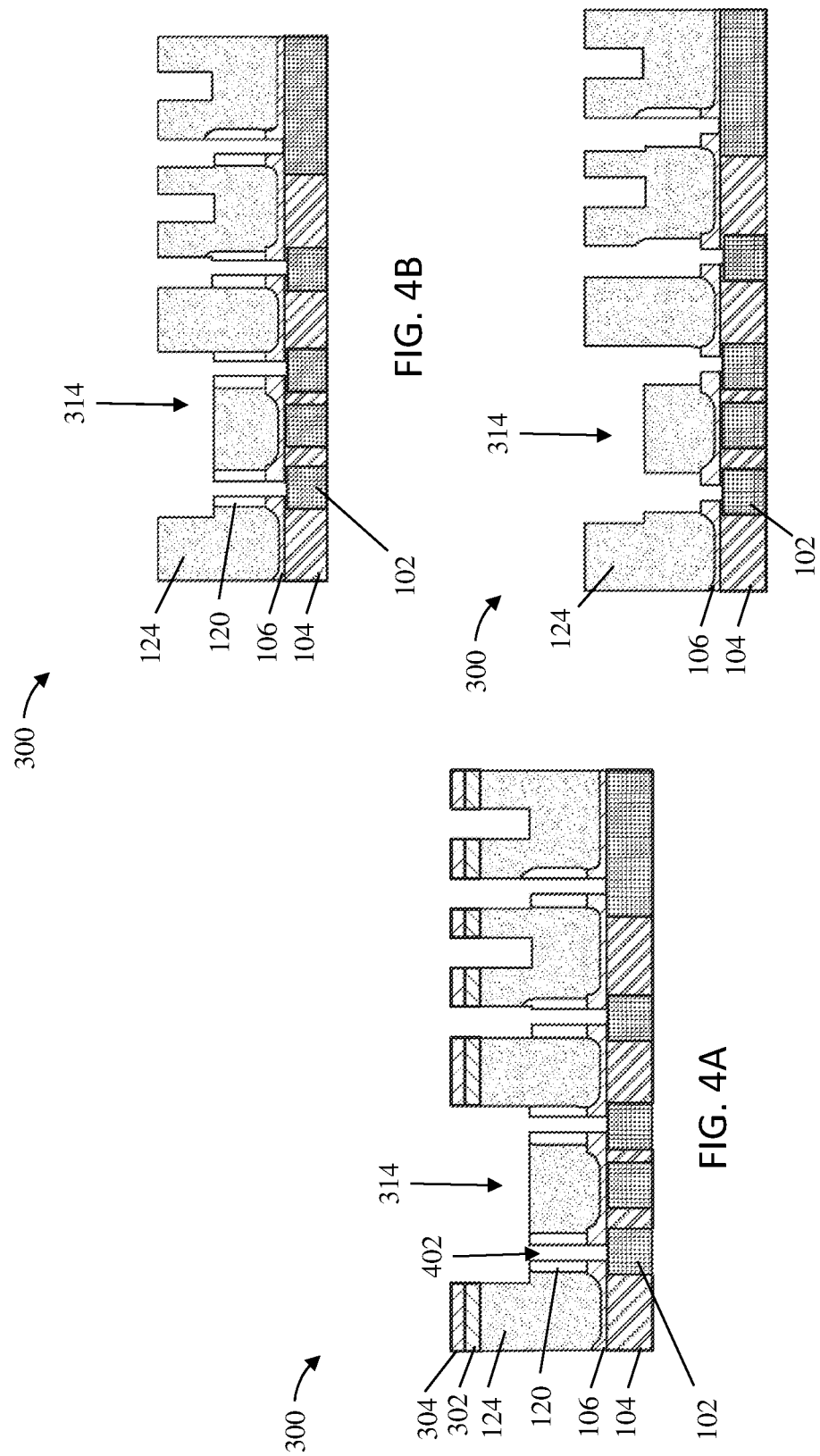

BACK-END-OF-LINE SINGLE DAMASCENE TOP VIA SPACER DEFINED BY PILLAR MANDRELS

BACKGROUND

The present invention generally relates to fabrication methods and resulting structures for semiconductor devices, and more specifically, to fabrication methods and resulting structures for a back-end-of-line (BEOL) single damascene (SD) top via spacer defined by pillar mandrels.

The fabrication of very large scale integrated (VLSI) or ultra large scale integrated (ULSI) circuits requires the manufacture of sophisticated interconnect structures including metallic wiring that connects individual devices in a semiconductor chip to one another. Typically, the wiring interconnect network consists of two types of features that serve as electrical conductors, namely, line features that traverse a distance across the chip, and conductive via features that connect lines in different levels. The conducting metal lines and conductive vias are made of conductive material, such as copper, aluminum, tungsten, ruthenium, molybdenum, silver, or alloys that include copper and tungsten, and are electrically insulated by interlayer dielectrics (ILD). In a multilayered interconnect structure, the metallization layers are referred to as "M" layers (e.g., M1 layer, M2 layer, etc.) while "V" layers denote the conductive vias placed between adjacent M layers (e.g., V1 is between the M1 and M2 layers).

To increase the number of circuits that can be provided on a chip, the semiconductor industry has repeatedly shrunk the transistor gate length and the chip size. As a consequence, the interconnect structure that forms the metallic circuitry has also shrunk. As integrated circuit (IC) feature sizes continue to decrease, the aspect ratio, (i.e., the ratio of height/depth to width) of features such as conductive vias generally increases, complicating the manufacturing process. Fabricating intricate structures of conductive interconnect layers and high aspect ratio vias within increasingly smaller wafer footprints is one of the most process-intensive and cost-sensitive portions of semiconductor IC fabrication.

SUMMARY

Embodiments of the invention are directed to a method for forming back-end-of-line (BEOL) single damascene (SD) top via spacers using pillar mandrels. A non-limiting example of the method includes forming a first conductive line in a first dielectric layer. A mandrel is formed over the first conductive line and a spacer is formed on a sidewall of the mandrel. A portion of a second dielectric layer is recessed to expose a top surface of the spacer and a top surface of the mandrel and the mandrel is removed. The spacer prevents damage to the second dielectric layer while removing the mandrel. The mandrel is replaced with a conductive material. A first portion of the conductive material defines a via and a second portion of the conductive material defines a second conductive line. The via couples the first conductive line to the second conductive line.

Embodiments of the invention are directed to a method for forming BEOL SD top via spacers using pillar mandrels. A non-limiting example of the method includes forming a first conductive line in a first dielectric layer. A mandrel is formed over the first conductive line and a second dielectric layer is formed over the first conductive line and on sidewalls of the mandrel. The second dielectric layer is recessed to expose a portion of the sidewalls of the mandrel and a spacer is formed on the exposed portions. A portion of a third dielectric layer is recessed to expose a top surface of the spacer and a top surface of the mandrel and the mandrel is removed. The spacer prevents damage to the second dielectric layer and the third dielectric layer while removing the mandrel. The mandrel is replaced with a conductive material. A first portion of the conductive material defines a via and a second portion of the conductive material defines a second conductive line. The via couples the first conductive line to the second conductive line.

Embodiments of the invention are directed to an integrated circuit. A non-limiting example of the integrated circuit includes a first conductive line in a first dielectric layer. The first conductive line is part of a metallization layer in an interconnect of the integrated circuit. A via is positioned on the first conductive line and a spacer is positioned on sidewalls of the via. A second conductive line is on the via and the spacer.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 1A depicts a cross-sectional view of an integrated circuit (IC) wafer during BEOL fabrication operations for forming interconnect structures on the wafer according to one or more embodiments of the invention;

FIG. 1B depicts a cross-sectional view of the IC wafer after a processing operation according to one or more embodiments of the invention;

FIG. 1C depicts a cross-sectional view of the IC wafer after a processing operation according to one or more embodiments of the invention;

FIG. 1D depicts a cross-sectional view of the IC wafer after a processing operation according to one or more embodiments of the invention;

FIG. 4A depicts a cross-sectional view of the IC wafer after a processing operation according to one or more embodiments of the invention;

FIGS. 4B and 4C depict alternative cross-sectional views of the IC wafer after processing operations according to one or more embodiments of the invention;

Figure 2A:
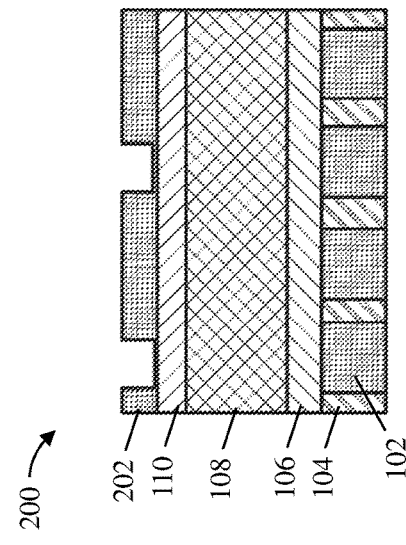
FIG. 2A depicts an alternative cross-sectional view of the IC wafer according to one or more embodiments of the invention.

The diagrams depicted herein are illustrative. There can be many variations to the diagrams or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

Integrated circuits having multiple layers often include interconnect layers with conductive lines called interconnects. The interconnects may be connected vertically to other interconnects or to devices (e.g., transistors) on the integrated circuit using vias that are generally formed by forming a high aspect ratio cavity in the integrated circuit and filling the cavity with conductive material. It is understood in advance that although example embodiments of the invention are described in connection with a particular interconnect architecture, embodiments of the invention are not limited solely to the architectures described in this specification. Rather, embodiments of the present invention are capable of being implemented in conjunction with any interconnect layer and can be implemented using materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, ICs are fabricated in a series of stages, including a front-end-of-line (FEOL) stage, a middle-of-line (MOL) stage, and a back-end-of-line (BEOL) stage. The process flows for fabricating modern ICs are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts (e.g., CA) and other structures that communicatively couple to active regions (e.g., gate, source, and drain) of the device element. For example, the silicidation of source/drain regions, as well as the deposition of metal contacts, can occur during the MOL stage to connect the elements patterned during the FEOL stage. Layers of interconnections (e.g., metallization layers) are formed above these logical and functional layers during the BEOL stage to complete the IC. Most ICs need more than one layer of wires to form all the necessary connections, and as many as 5-20 layers are added in the BEOL process. The various BEOL layers are interconnected by vias that couple from one layer to another.

Insulating dielectric materials are used throughout the layers of an IC to perform a variety of functions, including stabilizing the IC structure and providing electrical isolation of the IC elements. For example, the metal interconnecting wires in the BEOL region of the IC are isolated by dielectric layers to prevent the wires from creating a short circuit with other metal layers.

The continued scaling of semiconductor devices has resulted in challenging fabrication requirements, especially when fabricating ever smaller metallization layers. Advanced BEOL processes incorporate phase-shifting, optical proximity correction, and other practices to satisfy these scaling demands, and can achieve a line-to-line pitch below 30 nm. However, some challenges in fabricating advanced metallization layers remain. For example, mitigating or preventing via blowup and excess via chamfering, and maintaining critical dimension (CD) control, especially when patterning vias such as top vias, has become increasingly difficult as scaling continues. As used herein, a "top via" refers to the "V," layer via which electrically couples a line below (the "$M_x$" layer) to a line above (the "$M_{x+1}$" layer).

Turning now to an overview of aspects of the present invention, one or more embodiments of the invention address the above-described shortcomings of the prior art by providing a new semiconductor structure and a method for providing a BEOL SD top via spacer defined by pillar mandrels. This new process leverages a top via spacer to precisely define the via height and CD. The top via spacer also ensures a straight profile that reduces dielectric damage (e.g., ultra low-k, or ULK damage) and prevents via blowup. Leveraging a top via spacer formed according to one or more embodiments also prevents via chamfering, as the via is not subjected to subsequent mask strip and trench etch plasma exposure in a dual damascene scheme. In some embodiments of the invention, the top via spacer is defined using mandrels and a spacer etch-back. Advantageously, using mandrels in this manner allows for a small via CD below the lithographic limit. In some embodiments of the invention, K modulation around the bottom of the via is also improved.

Turning now to a more detailed description of aspects of the present invention, FIG. 1A depicts a cross-sectional view of a BEOL region of an IC wafer 100 during BEOL fabrication operations for forming interconnect structures on the IC wafer 100 according to one or more embodiments of the invention. At the fabrication stage depicted in FIG. 1A, known fabrication operations have been used to form one or more conductive lines 102 in a dielectric layer 104. While not shown for ease of illustration and discussion, the conductive lines 102 can be one of many lines in a metallization layer of the BEOL region of the IC wafer 100. Moreover, it is understood that the processes described herein with respect to the conductive lines 102 can be used to create metal interconnects in any of these metallization layers.

In some embodiments of the invention, the conductive lines 102 include conductive materials formed or deposited in a trench in the dielectric layer 104 using known BEOL processes. In some embodiments of the invention, the conductive line 102 is overfilled above a surface of the trench (not shown), forming overburdens that can be removed using, for example, a chemical-mechanical planarization (CMP) process. The conductive lines 102 can be made of any suitable conducting material, such as, for example, metal (e.g., tungsten, titanium, tantalum, ruthenium, zirconium, cobalt, copper, aluminum, platinum, molybdenum), alloys thereof (such as AlCu, CuMn, CuTi, or the like), conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the conductive line 102 is a copper line (copper interconnect). The conductive line 102 can be formed or deposited using, for example, CVD, PECVD, PVD, sputtering, plating, chemical solution deposition, and electroless plating.

In some embodiments of the invention, the dielectric layer 104 is an interlayer dielectric. The dielectric layer 104 serves as an isolation structure for the IC wafer 100. The dielectric layer 104 can be made of any suitable dielectric material, such as, for example, silicon oxide, fluorinated silicon oxide, low-k dielectrics (materials having a small dielectric constant relative to silicon dioxide, i.e., less than about 3.9), ultra-low-k dielectrics (materials having a dielectric constant less than 3), porous silicates, carbon doped oxides, silicon dioxides, silicon nitrides, silicon oxynitrides, silicon carbide (SiC), or other dielectric materials. Any known manner of forming the dielectric layer 104 can be utilized, such as, for example, CVD, PECVD, ALD, flowable CVD, spin-on dielectrics, or PVD.

In some embodiments of the invention, the conductive lines 102 are covered with a cap layer 106 that can include for example, a nitride or oxide material such as silicon nitride ($Si_xN_x$), silicon carbon nitride (SiCN), silicon oxynitride (SiON), or silicon oxide (SiOx), aluminum oxide (AlOx), or any other suitable insulator material.

In some embodiments of the invention, a mandrel layer 108 is formed on the cap layer 106 using, for example, CND, PECVD, PVL), a spin-on process, or combinations thereof. In one or more embodiments, the mandrel layer 108 is a sacrificial material that can be easily lithographically patterned and etched while providing good profile control. The mandrel layer 108 can be formed of a mandrel material including, but not limited to, amorphous silicon (a-Si), poly-silicon (p-Si), amorphous carbon (a-C), silicon-germanium (Site), an organic planarization layer (PPL), silicon oxide (SiO), silicon nitride (Sin or suitable combinations thereof or any type of organic or inorganic material. The OPL material can include, for example, a material having a hydrocarbon component of approximately 75%-90% with remaining components including a combination of oxygen with hydrogen, and nitrogen.

In some embodiments of the invention, a hard mask layer 110 is formed on the mandrel layer 108. The hard mask layer 110 can include any suitable dielectric material, such as, for example, an oxide or a low temperature oxide (LTO). In some embodiments of the invention, such as in the case of multi color via patterning, the hard mask layer 110 is a bilayer, such as an LTO/TiN stack. Multi color via patterning is discussed is more detail below (FIGS. 2A-2D).

In some embodiments of the invention, a planarizing layer 112 is formed on the hard mask layer 110. The planarizing layer 112 can be formed using, for example, an OPL material or amorphous carbon.

A hard mask layer 114 is formed on the planarizing layer 112. The hard mask layer 114 can include any suitable hard mask material, such as, for example, a silicon containing anti-reflective coating (SiARC). A resist mask 116 is formed on the hard mask layer 114. The resist mask 116 can be patterned using known lithographic processes.

FIG. 1B depicts a cross-sectional view of the IC wafer 100 after a processing operation according to one or more embodiments of the invention. In some embodiments of the invention, the mandrel layer 108 is patterned to define one or more mandrels 118. The mandrel layer 108 can be patterned using any suitable process. For example, a pattern in the resist mask 116 can be transferred to the hard mask layer 110 and the mandrel layer 108 using e-beam lithography, optical lithography, extreme EUV lithography, imprint lithography, directed self-assembly of block copolymers, a spatial line frequency doubling process, or a combination thereof, and related etch techniques (both wet and dry etching). In one or more embodiments, the mandrels 118 can have a linewidth of less than 15 nm. In some embodiments of the invention, the DCD of the mandrels 118 are further shrunk using a dry or wet etch process.

FIG. 1C depicts a cross-sectional view of the IC wafer 100 after a processing operation according to one or more embodiments of the invention. In some embodiments of the invention, the hard mask layer 110 is removed and spacers 120 are formed on sidewalls of the mandrels 118. In some embodiments of the invention, a spacer material (not separately shown) is conformally deposited over the mandrels 118 and the spacers 120 are defined using an etch-back process. The conformal spacer material can be deposited by, for example, atomic layer deposition or plasma enhanced atomic layer deposition, to control the final thickness of the spacers 120. Suitable spacer materials are generally chosen based on etch selectivity to the mandrel material (e.g., mandrels 118). In one or more embodiments, the spacers 120 can be silicon oxide (SiO), silicon nitride (SiN), oxynitride (SiON), silicon carbide (SiC), amorphous carbon (a-C), or combinations thereof, in some embodiments of the invention, the etch-back process includes removing portions of the spacer material from the top surfaces of the inandrels 118 and from top surfaces of the cap layer 106. In some embodiments of the invention, the etch-back process results in a recess 122 of the top cap layer 106. In some embodiments of the invention, the recess 122 is about 2 to 3 nm.

FIG. 1D depicts a cross-sectional view of the IC wafer 100 after a processing operation according to one or more embodiments of the invention. In some embodiments of the invention, a dielectric layer 124 is formed over the mandrels 118, the spacers 120, and the top cap layer 106. The dielectric layer 124 can be made of any suitable dielectric, such as, for example, silicon oxide, low-k materials, or ultra low-k materials.

FIG. 2A depicts an alternative cross-sectional view of an IC wafer 200 from that shown in FIG. 1A, according to one or more embodiments of the invention. As shown in FIG. 2A, the IC wafer 200 is constructed in much the same manner as the IC wafer 100 discussed previously with respect to FIG. 1A. For example, the IC wafer 200 includes one or more conductive lines 102 embedded in the dielectric layer 104. The conductive lines 102 are covered with the cap layer 106, the mandrel layer 108 is formed on the cap layer 106, and the hard mask layer 110 is formed on the mandrel layer 108.

As further shown in FIG. 2A, however, a memorization layer 202 is inserted between the hard mask layer 110 and the planarizing layer 112. In some embodiments of the invention, the memorization layer 202 is a TiN memorization layer, although other materials are within the contemplated scope of the disclosure. The planarizing layer 112 is formed on the memorization layer 202 and the hard mask layer 114 is formed on the planarizing layer 112.

In some embodiments of the invention, a first resist mask 204 is formed on the hard mask layer 114. The first resist mask 204 can be formed in a similar manner and from similar materials as the resist mask 116 discussed previously.

Figure 2B:
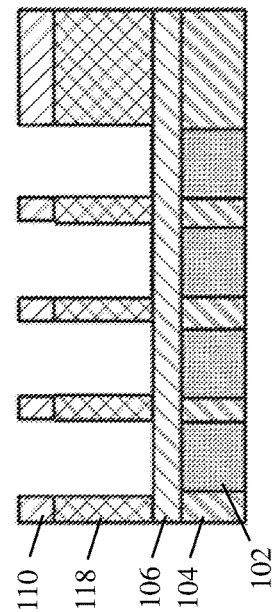
FIG. 2B depicts a cross-sectional view of the IC wafer after a processing operation according to one or more embodiments of the invention.

FIG. 2B depicts a cross-sectional view of the IC wafer 200 after a processing operation according to one or more embodiments of the invention. In some embodiments of the invention, a pattern in the first resist mask 204 can be transferred to the memorization layer 202. The pattern can be transferred using, for example, e-beam lithography, optical lithography, extreme EUV lithography, imprint lithography, directed self-assembly of block copolymers, a spatial line frequency doubling process, or a combination thereof, and related etch techniques (both wet and dry etching).

Figure 2C:
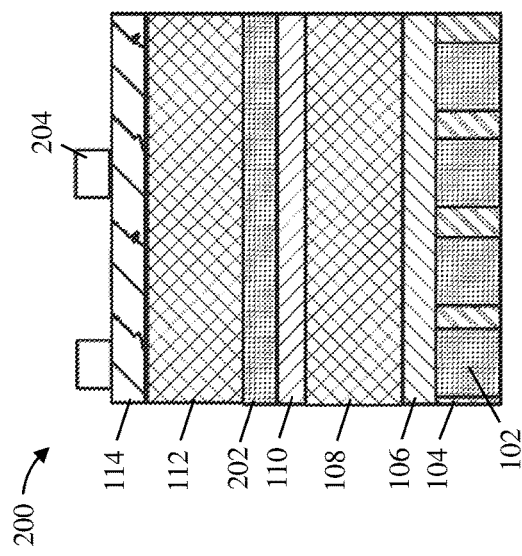
FIG. 2C depicts a cross-sectional view of the IC wafer after a processing operation according to one or more embodiments of the invention.

FIG. 2C depicts a cross-sectional view of the IC wafer 200 after a processing operation according to one or more embodiments of the invention. In some embodiments of the invention, the process outlined in FIGS. 2A and 2B is repeated to create a second pattern in a second resist mask 206.

In some embodiments of the invention, a planarizing layer 208 is formed on the memorization layer 202 and the hard mask layer 110. The planarizing layer 208 can be formed using, for example, an OPL material or amorphous carbon. In some embodiments of the invention, a hard mask layer 210 is formed on the planarizing layer 208. The hard mask layer 210 can include any suitable hard mask material, such as, for example, SiARC.

In some embodiments of the invention, the resist mask 206 is formed on the hard mask layer 210. The resist mask 206 can be formed and patterned using known processes, such as those discussed previously with respect to the first resist mask 204 and the resist mask 116. In some embodiments of the invention, the pattern in the second resist mask 206 is transferred to the memorization layer 202 (not separately shown), in the same manner as described with respect to the first resist mask 204. This general process, whereby successive resist masks are used to pattern the memorization layer 202, can be repeated arbitrarily (e.g., 2, 3, 5, 10 times, or more). In this manner, the memorization layer 202 enables multi color via patterning (where each "color" refers to a separate resist mask pattern). Advantageously, patterning the memorization layer 202 in this manner allows for patterns which are not achievable (i.e., below the lithographic limit) for single masks.

Figure 2D:
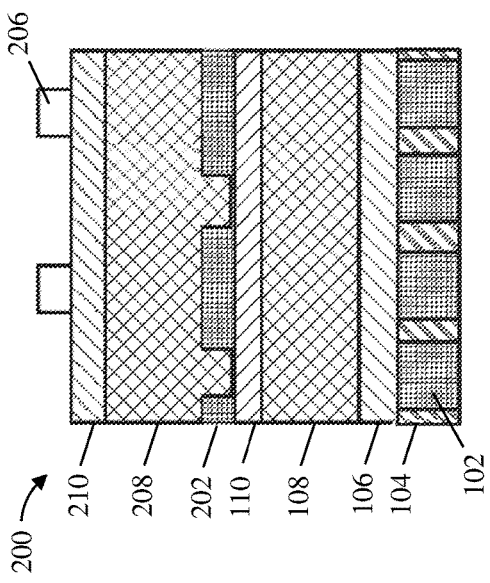
FIG. 2D depicts a cross-sectional view of the IC wafer after a processing operation according to one or more embodiments of the invention.

FIG. 2D depicts a cross-sectional view of the IC wafer 200 after a processing operation according to one or more embodiments of the invention. In some embodiments of the invention, the final (multi-color) pattern in the memorization layer 202 is transferred into the hard mask layer 110 and the mandrel layer 108, defining one or more mandrels 118 in the same manner as discussed previously with respect to FIG. 1B.

Figures 3A, 3B:
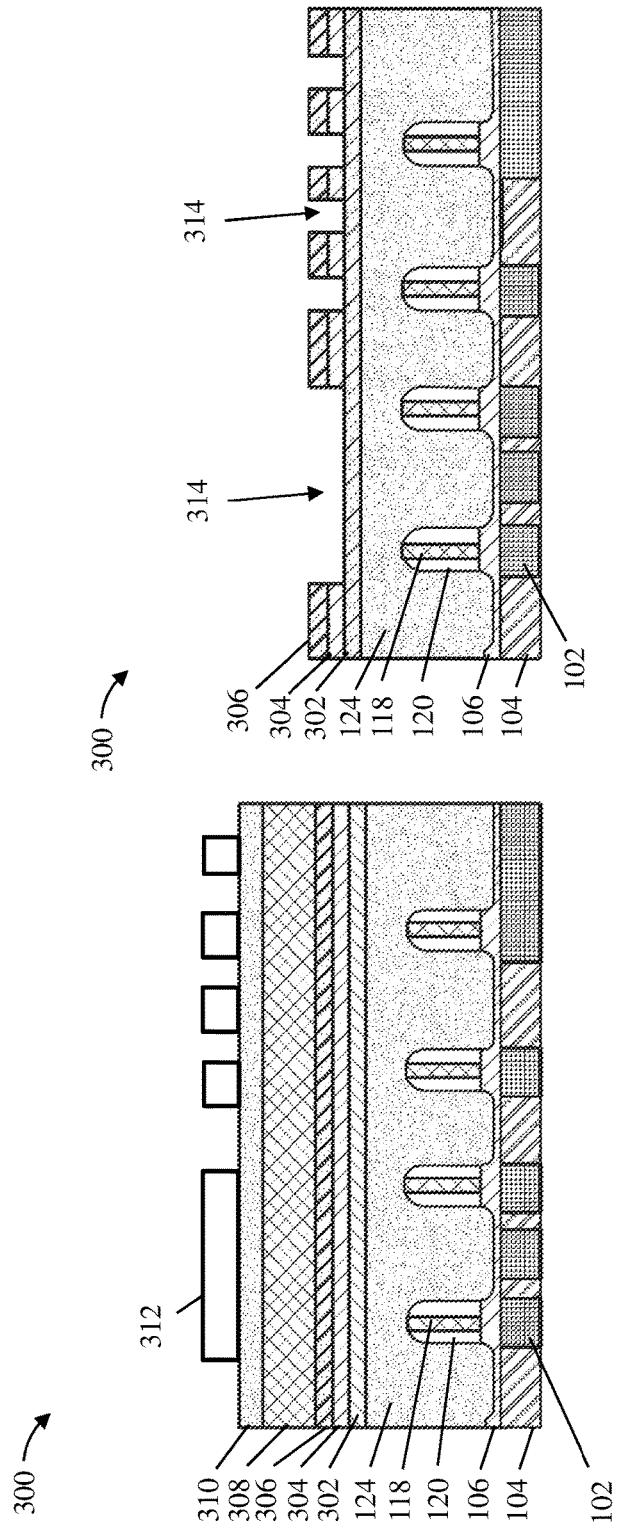
FIG. 3A depicts a cross-sectional view of an IC wafer during BEOL fabrication operations for forming interconnect structures on the wafer according to one or more embodiments of the invention.
FIG. 3B depicts a cross-sectional view of the IC wafer after a processing operation according to one or more embodiments of the invention.

FIG. 3A depicts a cross-sectional view of a BEOL region of an IC wafer 300 during BEOL fabrication operations for forming interconnect structures on the IC wafer 300 according to one or more embodiments of the invention. FIG. 3A follows generally from the process flow illustrated in FIG. 1D, albeit with a different arrangement of the mandrels 118 and the conductive lines 102. The particular arrangement is shown for ease of discussion only. It is understood that other arrangements are possible (e.g., the mandrels 118 can be patterned by changing the respective resist masks). The IC wafer 300 can be built from a single-color patterning scheme (e.g., FIGS. 1A-1B) or, alternatively, from a multi-color patterning scheme (e.g., FIGS. 2A-2D).

In some embodiments of the invention, a sacrificial layer 302 is formed on the dielectric layer 124. The sacrificial layer 302 can be formed of any suitable sacrificial material, such as, for example, a nitride or silicon nitride.

In some embodiments of the invention, a memorization layer 304 is formed on the sacrificial layer 302. In some embodiments of the invention, the memorization layer 304 is a TiN memorization layer, although other materials are within the contemplated scope of the disclosure.

In some embodiments of the invention, a memorization layer 306 is formed on the memorization layer 304. In some embodiments of the invention, the memorization layer 306 is a tetraethylorthosilicate (TEOS) memorization layer, although other memorization layers can be used.

In some embodiments of the invention, a patterning stack including a planarizing layer 308, hard mask layer 310, and resist mask 312 is formed on the memorization layer 306. The planarizing layer 308 can be formed using, for example, an OPL material or amorphous carbon. The hard mask layer 310 can include any suitable hard mask material, such as, for example, a silicon containing anti-reflective coating (SiARC). The resist mask 312 can be patterned using known lithographic processes.

FIG. 3B depicts a cross-sectional view of the IC wafer 300 after a processing operation according to one or more embodiments of the invention. In some embodiments of the invention, a pattern in the resist mask 312 is transferred to the memorization layer 306 and the memorization layer 304. After patterning, the resist mask 312, hard mask layer 310, and planarizing layer 308 are removed.

The resist mask 312, hard mask layer 310, and planarizing layer 308 can be removed using known processes, such as using a wet etch, a dry etch, or a combination of sequential wet and/or dry etches. OPL material can be removed using an etch or ashing process. In some embodiments of the invention, the pattern in the resist mask 312 is transferred to the memorization layer 306 and the memorization layer 304 using a reactive ion etch (RIE) to define one or more trenches 314 that each expose a surface of the sacrificial layer 302.

Figures 3C, 3D:
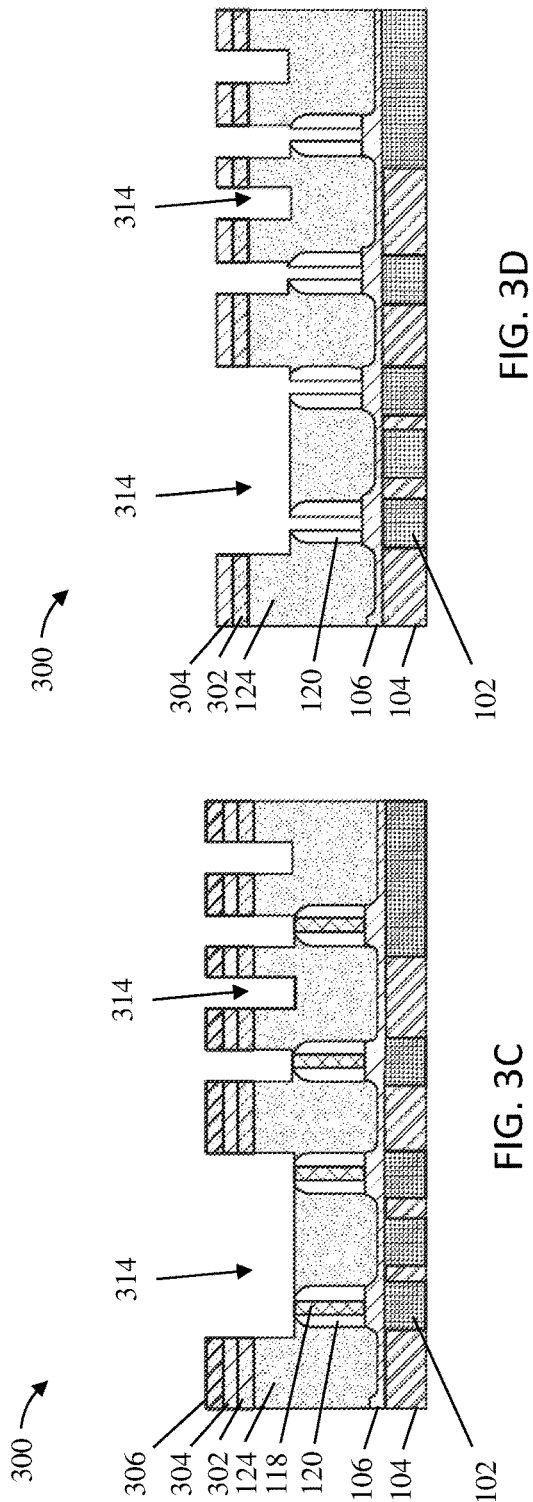
FIG. 3C depicts a cross-sectional view of the IC wafer after a processing operation according to one or more embodiments of the invention.
FIG. 3D depicts a cross-sectional view of the IC wafer after a processing operation according to one or more embodiments of the invention.

FIG. 3C depicts a cross-sectional view of the IC wafer 300 after a processing operation according to one or more embodiments of the invention. In some embodiments of the invention, portions of the sacrificial layer 302 are removed to expose a surface of the dielectric layer 124 using, for example, a wet etch, a dry etch, or a combination of sequential wet and/or dry etches. In some embodiments of the invention, the dielectric layer 124 is recessed (i.e., the one or more trenches 314 are recessed) to a top surface of the mandrels 118.

FIG. 3D depicts a cross-sectional view of the IC wafer 300 after a processing operation according to one or more embodiments of the invention. In some embodiments of the invention, the mandrels 118 are removed using, for example, a wet etch, a dry etch, or a combination of sequential wet and/or dry etches. In some embodiments of the invention, the mandrels 118 are removed using a RIE selective to the spacers 120 and/or the dielectric layer 124. This selective process can be referred to as a mandrel pull.

FIG. 4A depicts a cross-sectional view of the IC wafer 300 after a processing operation according to one or more embodiments of the invention. In some embodiments of the invention, portions of the cap layer 106 are removed to define a via 402 that exposes a surface of the conductive lines 102. Portions of the cap layer 106 can be removed using, for example, a wet etch, a dry etch, or a combination of sequential wet and/or dry etches. In some embodiments of the invention, the removal process for the cap layer 106 will partially etch the sacrificial layer 302 and the memorization layer 304 resulting a rounded shape form (rounded edge/corner profile). The etch erosion of the corners of the layers 302, 304 is beneficial for an easier metallization. Advantageously, the presence of the spacers 120 prevents damage to the surface of the dielectric layer 124 while removing the mandrels 118 and the cap layer 106. Consequently, via blowup and excess via chamfering is avoided, and critical dimension (CD) control (width and height) over the via 402 is maintained.

FIGS. 4B and 4C represent alternative continuations from the IC wafer 300 depicted in FIG. 4A. Specifically, FIG. 4B (and its respective following figures) illustrates a processing scheme whereby the spacers 120 remain in the IC wafer 300. Conversely, FIG. 4C (and its respective following figures) illustrates a processing scheme whereby the spacers 120 are removed.

As shown in FIG. 4B, in some embodiments of the invention, the sacrificial layer 302 and the memorization layer 304 can be removed using, for example, a wet etch, a dry etch, or a combination of sequential wet and/or dry etches. In some embodiments of the invention, the sacrificial layer 302 and the memorization layer 304 are removed using one or more RIEs selective to the dielectric layer 124, the cap layer 106, and/or the spacers 120.

As shown in FIG. 4C, in some embodiments of the invention, the sacrificial layer 302, the memorization layer 304, and the spacers 120 can be removed using, for example, a wet etch, a dry etch, or a combination of sequential wet and/or dry etches. In some embodiments of the invention, the sacrificial layer 302, the memorization layer 304, and the spacers 120 are removed using one or more RIEs selective to the dielectric layer 124 and/or the cap layer 106.

Figure 5A:
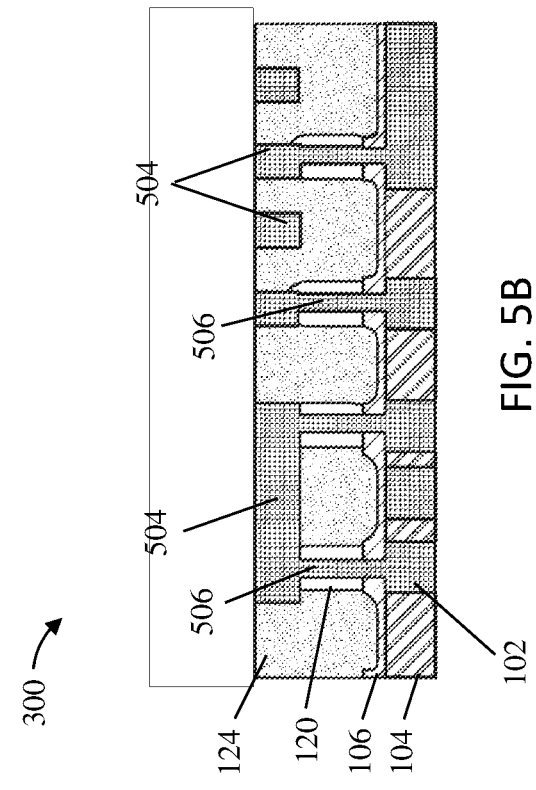
FIG. 5A depicts a cross-sectional view of the IC wafer of FIG. 4B after a processing operation according to one or more embodiments of the invention.

FIG. 5A depicts a cross-sectional view of the IC wafer 300 after a processing operation according to one or more embodiments of the invention. FIG. 5A represents a continuation from the IC wafer 300 depicted in FIG. 4B. In some embodiments of the invention, a conductive material 502 is deposited over the IC wafer 300. In some embodiments of the invention, the conductive material 502 can be formed or deposited in the trenches 314 using known BEOL processes. For example, the conductive material 502 can be overfilled above a surface of the trenches 314 (not shown), forming overburdens that can be removed using, for example, a chemical-mechanical planarization (CMP) process.

The conductive material 502 can be made of any suitable conducting material, such as, for example, metal (e.g., tungsten, titanium, tantalum, ruthenium, zirconium, cobalt, copper, aluminum, platinum), alloys thereof (such as AlCu, CuMn, CuTi, or the like), conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. The conductive material 502 can be formed or deposited using, for example, CVD, PECVD, PVD, sputtering, plating, chemical solution deposition, and electroless plating. In some instances, the conductive material 502 can be formed by depositing a metal liner (not separately shown) prior to depositing the bulk of the metal. Metal liners are optional based on the metal to be used.

Figure 5B:
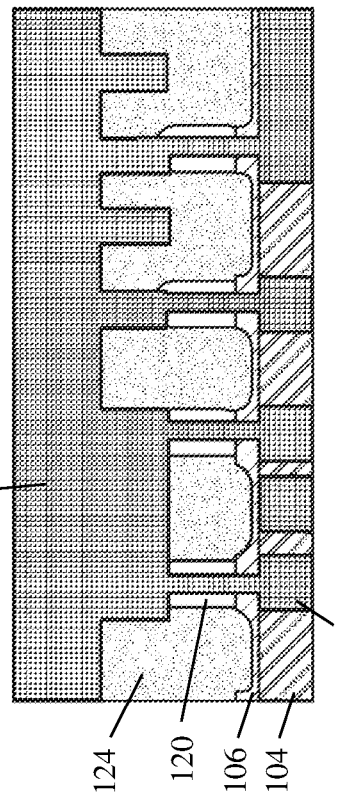
FIG. 5B depicts a cross-sectional view of the IC wafer of FIG. 5A after a processing operation according to one or more embodiments of the invention.

FIG. 5B depicts a cross-sectional view of the IC wafer 300 after a processing operation according to one or more embodiments of the invention. FIG. 5B represents a continuation from the IC wafer 300 depicted in FIG. 5A. In some embodiments of the invention, the conductive material 502 is planarized using, for example, CMP, to define one or more conductive lines 504 and one or more conductive vias 506. Here, the portion of the conductive material 502 between the conductive lines 102 and the conductive lines 504 defines the conductive vias 506.

Figure 5C:
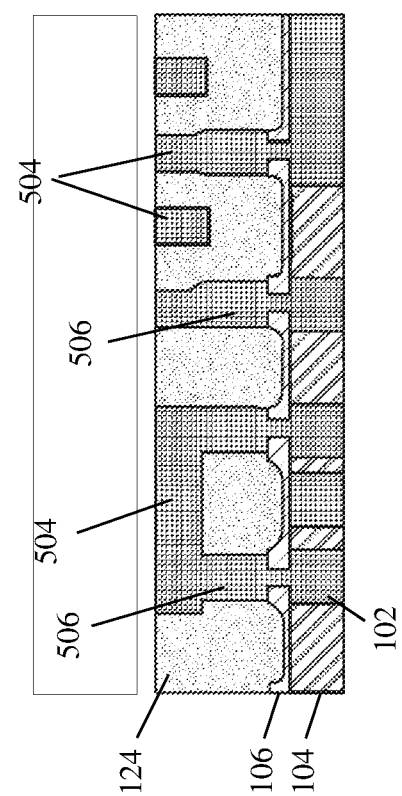
FIG. 5C depicts a cross-sectional view of the IC wafer of FIG. 4C after a processing operation according to one or more embodiments of the invention.

FIG. 5C depicts a cross-sectional view of the IC wafer 300 after a processing operation according to one or more embodiments of the invention. FIG. 5C represents a continuation from the IC wafer 300 depicted in FIG. 4C. In some embodiments of the invention, a conductive material 502 is deposited over the IC wafer 300, in a similar manner as discussed with respect to FIG. 5A. In contrast to the process shown in FIG. 5A, however, the conductive material 502 additionally fills the region previously occupied by the spacers 120.

Figure 5D:
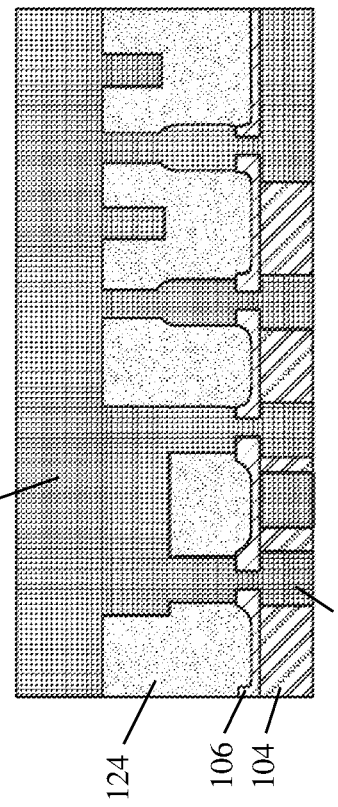
FIG. 5D depicts a cross-sectional view of the IC wafer of FIG. 5C after a processing operation according to one or more embodiments of the invention.

FIG. 5D depicts a cross-sectional view of the IC wafer 300 after a processing operation according to one or more embodiments of the invention. FIG. 5D represents a continuation from the IC wafer 300 depicted in FIG. 5C. In some embodiments of the invention, the conductive material 502 is planarized using, for example, CMP, to define one or more conductive lines 504 and one or more conductive vias 506. In contrast to the process shown in FIG. 5B, however, the width of the conductive vias 506 will be greater due to the removal of the spacers 120.

Following the formation of the conductive lines 504 and the conductive vias 506 from either FIG. 5B or FIG. 5D, the fabrication process can continue using known BEOL processes. In some embodiments of the invention, the conductive lines 102 define a first metallization layer (e.g., an "M1" layer), the conductive vias 506 define a first via layer (e.g., a "V1" layer), and the conductive lines 504 define a second metallization layer (e.g., an "M2" layer). In some embodiments of the invention, known BEOL processes are used to build additional M and V layers (i.e., layers above) to complete the IC wafer 300. In some embodiments of the invention, the additional M and V layers are built prior to the conductive lines 102, 504 and the conductive vias 506 (i.e., layers below).

In some embodiments of the invention, the alternative processes ending in FIGS. 5B and 5D are used in parallel within the same interconnect structure. For example, a first portion of the lines and vias of the interconnect structure can be formed using the process shown in FIGS. 4B, 5A, and 5B, while a second portion of the lines and vias can be formed using the process shown in FIGS. 4C, 5C, and 5D.

Figure 6B:
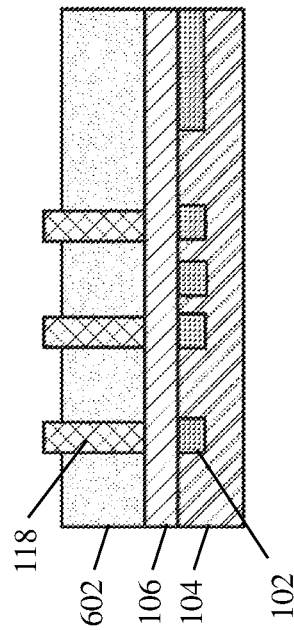
FIG. 6B depicts a cross-sectional view of the IC wafer after a processing operation according to one or more embodiments of the invention.
Figure 6D:
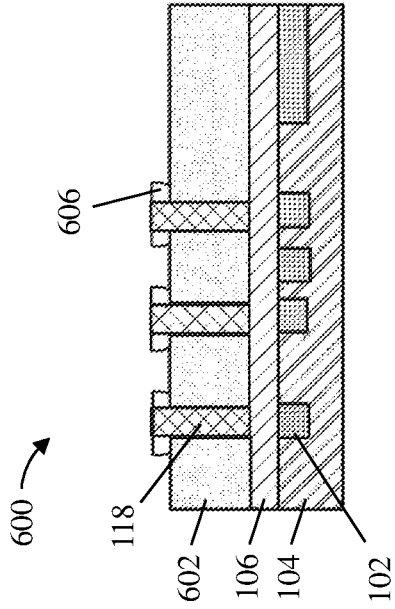
FIG. 6D depicts a cross-sectional view of the IC wafer after a processing operation according to one or more embodiments of the invention.
Figure 6A:
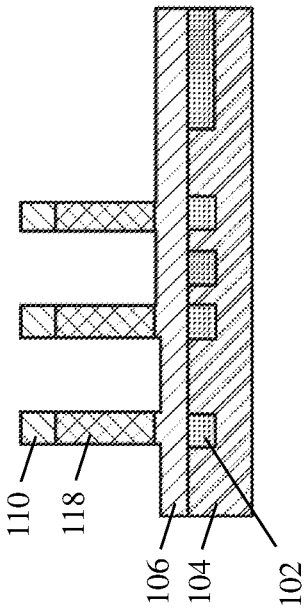
FIG. 6A depicts a cross-sectional view of an IC wafer during BEOL fabrication operations for forming interconnect structures on the wafer according to one or more embodiments of the invention.

FIG. 6A depicts an alternative cross-sectional view of an IC wafer 600 from that shown in FIG. 1B, according to one or more embodiments of the invention. As shown in FIG. 6A, the IC wafer 600 is constructed in much the same manner as the IC wafer 100 discussed previously with respect to FIG. 1B. For example, the IC wafer 600 includes one or more conductive lines 102 embedded in the dielectric layer 104. The conductive lines 102 are covered with the cap layer 106, and the hard mask layer 110 and mandrels 118 are formed on the cap layer 106.

FIG. 6B depicts a cross-sectional view of the IC wafer 600 after a processing operation according to one or more embodiments of the invention. In some embodiments of the invention, a dielectric layer 602 is formed over the mandrels 118. The dielectric layer 602 can be made of any suitable dielectric, such as, for example, silicon oxide, low-k materials, or ultra low-k materials.

In some embodiments of the invention, the dielectric layer 602 is recessed below a top surface of the mandrels 118. In some embodiments of the invention, the hard mask layer 110 is removed during, prior, or after recessing the dielectric layer 602. The dielectric layer 602 can be recessed and the hard mask layer 110 can be remove using, for example, a wet etch, a dry etch, or a combination of sequential wet and/or dry etches. In some embodiments of the invention, the dielectric layer 602 is recessed selective to the mandrels 118.

Figure 6C:
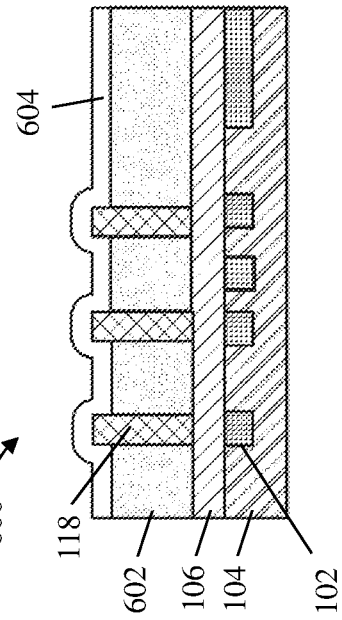
FIG. 6C depicts a cross-sectional view of the IC wafer after a processing operation according to one or more embodiments of the invention.

FIG. 6C depicts a cross-sectional view of the IC wafer 600 after a processing operation according to one or more embodiments of the invention. In some embodiments of the invention, a spacer material 604 conformally deposited over the dielectric layer 602. The spacer material 604 can be deposited by, for example, atomic layer deposition or plasma enhanced atomic layer deposition, to control the final thickness of the spacers 606 (FIG. 6D). Suitable spacer materials are generally chosen based on etch selectivity to the mandrel material (e.g., mandrels 118). In one or more embodiments, the spacer material 604 can include silicon oxide (SiO), silicon nitride (SiN), silicon oxynitride (SiON), silicon carbide (SiC), amorphous carbon (a-C), or combinations thereof.

FIG. 6D depicts a cross-sectional view of the IC wafer 600 after a processing operation according to one or more embodiments of the invention. In some embodiments of the invention, the spacer material 604 is partially removed using a spacer etch-back process (sometimes referred to as SEB) to define the spacers 606. The SEB process can include, for example, using a wet etch, a dry etch, or a combination of sequential wet and/or dry etches.

In some embodiments of the invention, the SEB process results in removing the spacer material 604 from the top surface of the mandrels 118. In some embodiments of the invention, the SEB process further exposes a surface of the dielectric layer 602. In this manner, the spacers 606 are confined to sidewalls of the mandrels 118 (as shown in FIG. 6D). In some embodiments of the invention, the SEB process results in a further recessing of the dielectric layer 602 (not separately shown).

Figure 7C:
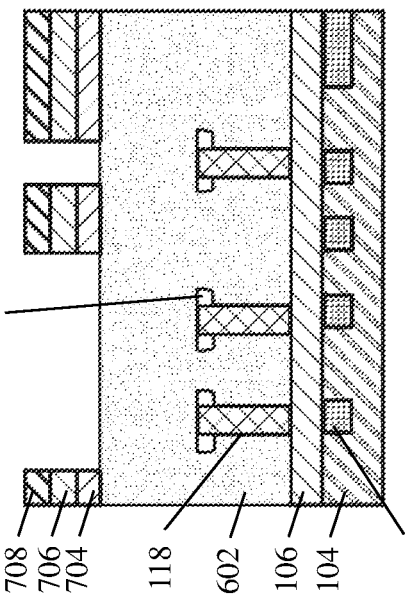
FIG. 7C depicts a cross-sectional view of the IC wafer after a processing operation according to one or more embodiments of the invention.
Figure 7A:
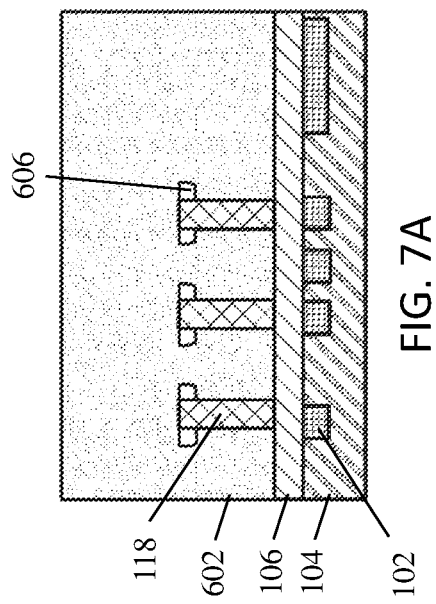
FIGS. 7A and 7B depict alternative cross-sectional views of the IC wafer after processing operations according to one or more embodiments of the invention.
Figure 7B:
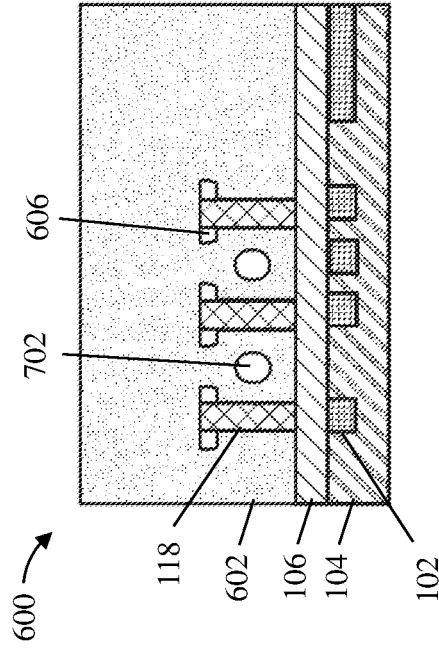

FIGS. 7A and 7B represent alternative continuations from the IC wafer 600 depicted in FIG. 6D. Specifically, FIG. 7A illustrates a processing scheme without airgaps, while conversely, FIG. 7B illustrates a processing scheme whereby airgaps 702 are formed between the mandrels 118.

As shown in FIG. 7A, in some embodiments of the invention, the dielectric layer 602 can be refilled with additional dielectric material. The additional dielectric material can be the same or different than the original dielectric material of the dielectric layer 602.

As shown in FIG. 7B, in some embodiments of the invention, airgaps 702 can be formed between the mandrels 118 while refilling the dielectric layer 602 (in an otherwise same manner as discussed with respect to FIG. 7A). This is possible, for example, when the SEB process results in a deeper recess of the dielectric layer 602 (not separately shown).

FIG. 7C depicts a cross-sectional view of the IC wafer 600 after a processing operation according to one or more embodiments of the invention. FIG. 7C follows generally from either the process flow illustrated in FIG. 7A or the process flow illustrated in FIG. 7B. In some embodiments of the invention, a sacrificial layer 704, a memorization layer 706, and a memorization layer 708 are formed on the dielectric layer 602, in a similar manner as discussed previously herein.

In some embodiments of the invention, a pattern is transferred into the sacrificial layer 704, the memorization layer 706, and the memorization layer 708. For example, a hard mask and resist mask (not separately shown) can be formed over the respective structures and a pattern therein can be transferred as described previously. In some embodiments of the invention, portions of the sacrificial layer 704, the memorization layer 706, and the memorization layer 708 are removed to expose a top surface of the dielectric layer 602. The sacrificial layer 704, the memorization layer 706, and the memorization layer 708 can be removed using known processes, such as using a wet etch, a dry etch, or a combination of sequential wet and/or dry etches.

Figure 8A:
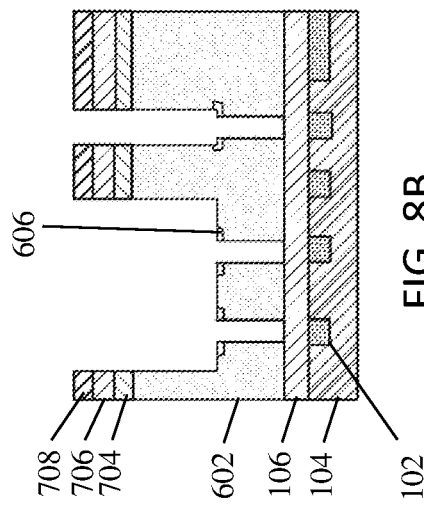
FIG. 8A depicts a cross-sectional view of the IC wafer after a processing operation according to one or more embodiments of the invention.

FIG. 8A depicts a cross-sectional view of the IC wafer 600 after a processing operation according to one or more embodiments of the invention. In some embodiments of the invention, the dielectric layer 602 is recessed to define a trench 802 that exposes a top surface of the mandrels 118 and a surface of the spacers 606.

Figure 8B:
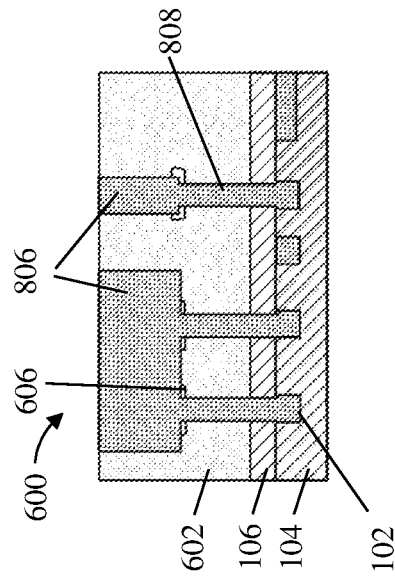
FIG. 8B depicts a cross-sectional view of the IC wafer after a processing operation according to one or more embodiments of the invention.

FIG. 8B depicts a cross-sectional view of the IC wafer 600 after a processing operation according to one or more embodiments of the invention. In some embodiments of the invention, the mandrels 118 are removed using, for example, a wet etch, a dry etch, or a combination of sequential wet and/or dry etches. In some embodiments of the invention, the mandrels 118 are removed using a RIE selective to the spacers 606 and/or the dielectric layer 602. This selective process can be referred to as a mandrel pull.

Figure 8C:
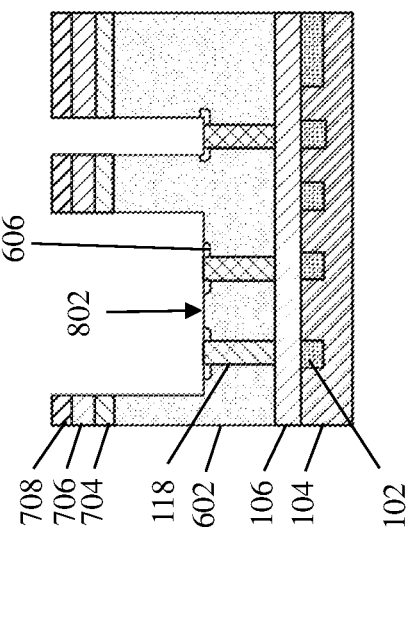
FIG. 8C depicts a cross-sectional view of the IC wafer after a processing operation according to one or more embodiments of the invention.

FIG. 8C depicts a cross-sectional view of the IC wafer 600 after a processing operation according to one or more embodiments of the invention. In some embodiments of the invention, the sacrificial layer 704, the memorization layer 706, and the memorization layer 708 are removed using, for example, a wet etch, a dry etch, or a combination of sequential wet and/or dry etches.

In some embodiments of the invention, portions of the cap layer 106 are removed to define a via 804 that exposes a surface of the conductive lines 102. Portions of the cap layer 106 can be removed using, for example, a wet etch, a dry etch, or a combination of sequential wet and/or dry etches. In some embodiments of the invention, portions of the cap layer 106 are removed selective to the spacers 606. Advantageously, the presence of the spacers 606 prevents damage to the surface of the dielectric layer 602 while removing the mandrels 118 and the cap layer 106. Consequently, via blowup and excess via chamfering is avoided, and critical dimension (CD) control (width and height) over the via 804 is maintained.

Figure 8D:
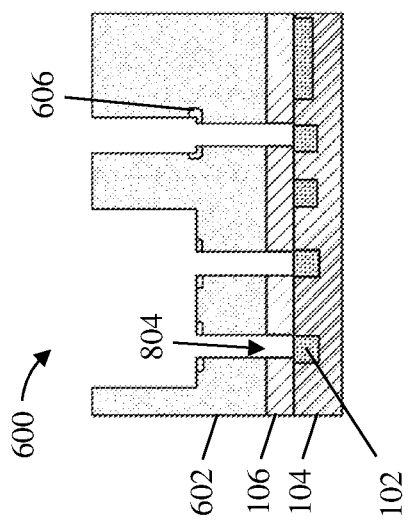
FIG. 8D depicts a cross-sectional view of the IC wafer after a processing operation according to one or more embodiments of the invention.

FIG. 8D depicts a cross-sectional view of the IC wafer 600 after a processing operation according to one or more embodiments of the invention. In some embodiments of the invention, a conductive material (not separately shown) is deposited over the IC wafer 600 and planarized to define one or more conductive lines 806 and one or more conductive vias 808. In some embodiments of the invention, the conductive material overfills one or more trenches (not separately shown), forming overburdens that are removed using, for example, CMP.

Following the formation of the conductive lines 806 and the conductive vias 808, the fabrication process can continue using known BEOL processes to complete the IC wafer 100. In some embodiments of the invention, the conductive lines 102 define a first metallization layer (e.g., an "M1" layer), the conductive vias 808 define a first via layer (e.g., a "V1" layer), and the conductive lines 806 define a second metallization layer (e.g., an "M2" layer). In some embodiments of the invention, known BEOL processes are used to build additional M and V layers (i.e., layers above) to complete the IC wafer 600. In some embodiments of the invention, the additional M and V layers are built prior to the conductive lines 102, 806 and the conductive vias 808 (i.e., layers below). In addition to its BEOL region, the completed IC wafer 100 will include FEOL and MOL structures (not shown).

Figure 9:
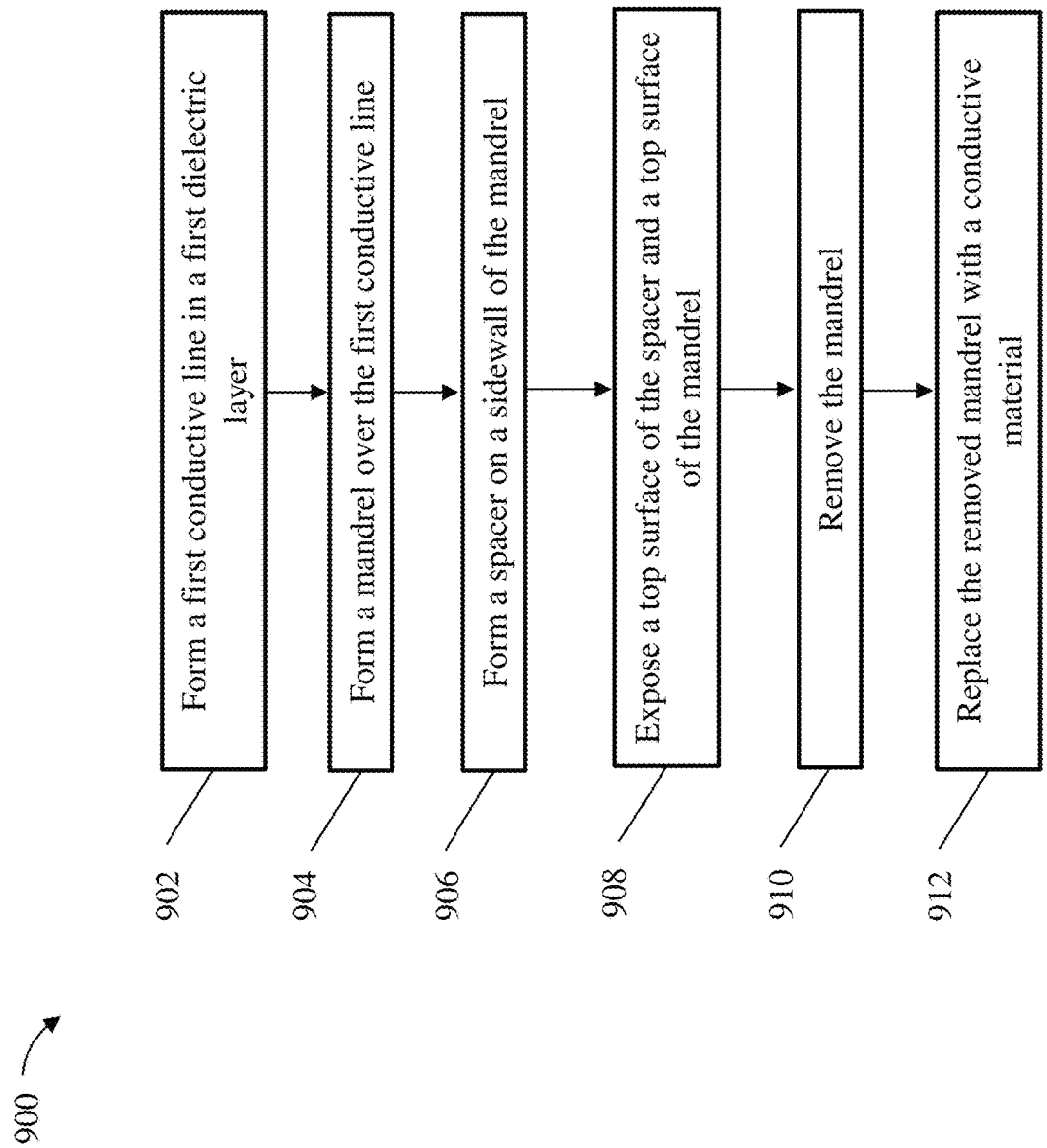
FIG. 9 depicts a flow diagram illustrating a method according to one or more embodiments of the invention.

FIG. 9 depicts a flow diagram 900 illustrating a method for providing a BEOL top via spacer defined by pillar mandrels in a metallization region of an integrated circuit according to one or more embodiments of the invention. As shown at block 902, a first conductive line is formed in a first dielectric layer. The first conductive line defines all or part of a metallization layer in the interconnect.

At block 904, a mandrel is formed over the first conductive line. In some embodiments of the invention, forming the mandrel includes a multi-color patterning scheme, as discussed previously herein. At block 906, a spacer is formed on a sidewall of the mandrel.

At block 908, a portion of a second dielectric layer is recessed to expose a top surface of the spacer and a top surface of the mandrel. At block 910, the mandrel is removed. Advantageously, the spacer prevents damage to the second dielectric layer while removing the mandrel, as discussed previously herein.

At block 912, the mandrel is replaced with a conductive material. In some embodiments of the invention, a first portion of the conductive material defines a via and a second portion of the conductive material defines a second conductive line. In some embodiments of the invention, the via couples the first conductive line to the second conductive line.

The method can further include removing the spacer prior to replacing the mandrel with the conductive material. In some embodiments of the invention, a height of the via is defined by a height of the mandrel. As used herein, the "height" of the via and the "height" of the mandrel do not strictly refer to the length of the respective element in the vertical direction orthogonal to the underlying substrate (e.g., dielectric layer 104), but rather to the relative position of the topmost surface of the respective element. In some embodiments of the invention, a width of the via is defined by a thickness of the mandrel. In some embodiments of the invention, a width of the via is defined by a thickness of the spacer.

In some embodiments of the invention, a cap layer is formed between the first conductive line and the mandrel. In some embodiments of the invention, a portion of the cap layer is removed to expose a surface of the first conductive line.

In some embodiments of the invention, the spacer is in direct contact with a bottom surface of the second conductive line and a top surface of the cap layer. In some embodiments of the invention, a portion of a dielectric layer is between the spacer and a top surface of the cap layer.

In some embodiments of the invention, an airgap is formed between the via and a second via (i.e., an adjacent via in the same metallization or "V" layer).

Figure 10:
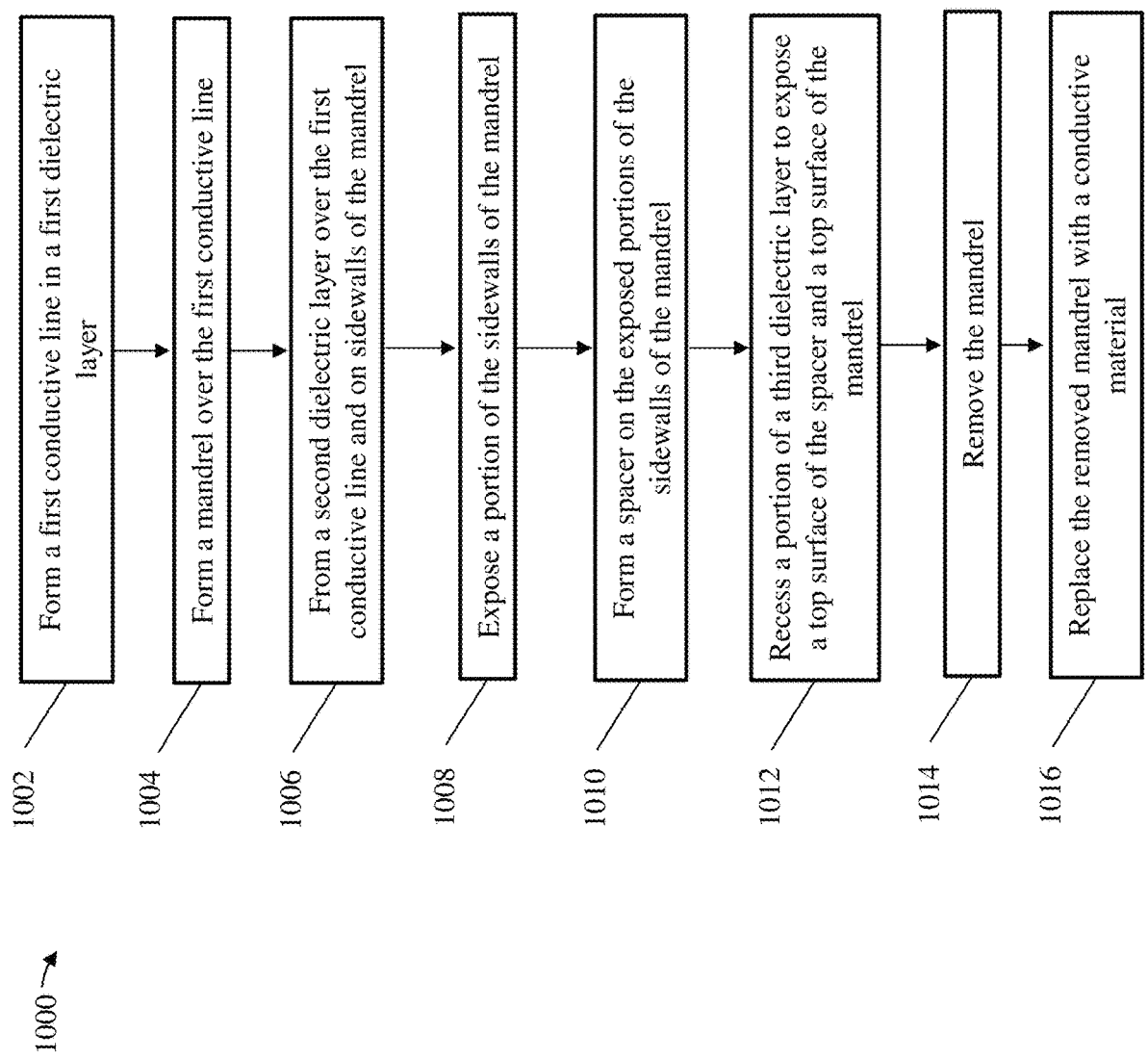
FIG. 10 depicts a flow diagram illustrating a method according to one or more embodiments of the invention.

FIG. 10 depicts a flow diagram 1000 illustrating a method for providing a BEOL SD top via spacer defined by pillar mandrels in a metallization region of an integrated circuit according to one or more embodiments of the invention. As shown at block 1002, a first conductive line is formed in a first dielectric layer. The first conductive line defines all or part of a metallization layer in the interconnect.

At block 1004, a mandrel is formed over the first conductive line. In some embodiments of the invention, forming the mandrel includes a multi-color patterning scheme.

At block 1006, a second dielectric layer is formed over the first conductive line and on sidewalls of the mandrel. At block 1008, the second dielectric layer is recessed to expose a portion of the sidewalls of the mandrel.

At block 1010, a spacer is formed on the exposed portions of the sidewalls of the mandrel. At block 1012, a portion of a third dielectric layer is recessed to expose a top surface of the spacer and a top surface of the mandrel. At block 1014, the mandrel is removed. The spacer prevents damage to the second dielectric layer and the third dielectric layer while removing the mandrel.

At block 1016, the mandrel is replaced with a conductive material. In some embodiments of the invention, a first portion of the conductive material defines a via and a second portion of the conductive material defines a second conductive line. In some embodiments of the invention, the via couples the first conductive line to the second conductive line.

In some embodiments of the invention, an airgap is formed between the mandrel and a second mandrel.

In some embodiments of the invention, a height of the via is defined by a height of the mandrel. In some embodiments of the invention, a width of the via is defined by a thickness of the mandrel.

In some embodiments of the invention, a cap layer is formed between the first conductive line and the mandrel. In some embodiments of the invention, a portion of the cap layer is removed to expose a surface of the first conductive line.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention of the invention, epitaxial growth and/or deposition processes can be selective to forming on semiconductor surface, and may or may not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a top via in an interconnect of an integrated circuit, the method comprising:
    forming a first conductive line in a first dielectric layer, wherein the first conductive line comprises a metallization layer in the interconnect;
    forming a mandrel over the first conductive line;
    forming a spacer on a sidewall of the mandrel;
    disposing a second dielectric layer around an external sidewall of the spacer and on a topmost surface of the mandrel and a topmost surface of the spacer;

removing a portion of the second dielectric layer, thereby exposing a top surface of the spacer and a top surface of the mandrel;

removing the mandrel, wherein the spacer prevents damage to the second dielectric layer while removing the mandrel; and replacing the removed mandrel with a conductive material, wherein a first portion of the conductive material defines a via and a second portion of the conductive material defines a second conductive line, and wherein the via couples the first conductive line to the second conductive line.

2. The method of claim 1, wherein a height of the via is defined by a height of the mandrel.

3. The method of claim 2, wherein a width of the via is defined by a thickness of the mandrel.

4. The method of claim 1 further comprising removing the spacer prior to replacing the mandrel with the conductive material.

5. The method of claim 4, wherein a width of the via is defined by a thickness of the spacer.

6. The method of claim 1 further comprising forming a cap layer between the first conductive line and a mandrel layer.

7. The method of claim 6 further comprising removing a portion of the cap layer to expose a surface of the first conductive line.

8. The method of claim 1, wherein forming the mandrel comprises a multi-color patterning.

* * * * *